United States Patent
Diekmann et al.

(10) Patent No.: US 9,245,929 B2
(45) Date of Patent: Jan. 26, 2016

(54) LIGHT-EMITTING COMPONENT ARRANGEMENT

(71) Applicant: OSRAM Opto Semiconductors GmbH, Regensburg (DE)

(72) Inventors: Karsten Diekmann, Rattenberg (DE); Simon Schicktanz, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/365,108

(22) PCT Filed: Dec. 13, 2012

(86) PCT No.: PCT/EP2012/075331
§ 371 (c)(1),
(2) Date: Jun. 13, 2014

(87) PCT Pub. No.: WO2013/087745
PCT Pub. Date: Jun. 20, 2013

(65) Prior Publication Data
US 2015/0115237 A1    Apr. 30, 2015

(30) Foreign Application Priority Data
Dec. 16, 2011   (DE) .......................... 10 2011 056 570

(51) Int. Cl.
*H01L 27/32* (2006.01)
*H01L 51/00* (2006.01)
(Continued)

(52) U.S. Cl.
CPC . *H01L 27/32* (2013.01); *F21K 9/00* (2013.01); *F21S 2/005* (2013.01); *F21V 23/06* (2013.01); *H01L 51/0097* (2013.01); *H01L 51/52* (2013.01); *H05K 1/189* (2013.01); *F21V 21/005* (2013.01); *F21Y 2101/02* (2013.01);
(Continued)

(58) Field of Classification Search
None
See application file for complete search history.

(56) References Cited

U.S. PATENT DOCUMENTS 4,173,035 A    10/1979   Hoyt
5,321,593 A *   6/1994   Moates .................. F21S 4/006
                                                          362/227

(Continued)

FOREIGN PATENT DOCUMENTS

DE    102007060585 A1    6/2009
DE    102009020851 A1    11/2010
(Continued)

OTHER PUBLICATIONS

International Preliminary Report on Patentability issued in the corresponding PCT applicaiton No. PCT/EP2012/075331, dated Jun. 17, 2014.
(Continued)

*Primary Examiner* — Steven Loke
*Assistant Examiner* — Juanita Rhodes
(74) *Attorney, Agent, or Firm* — Viering, Jentschura & Partner (57) ABSTRACT

A light-emitting component arrangement may include at least one flexible printed circuit board, at least one light-emitting component coupled to the flexible printed circuit board, at least one electromechanical connecting part, wherein the connecting part is mechanically fixed to the flexible printed circuit board and is electrically coupled to the light-emitting component, and wherein the connecting part has an electromechanical connection for mechanically and electrically connecting a connecting element which is external to the printed circuit board.

8 Claims, 6 Drawing Sheets

(51) Int. Cl.

| | |
|---|---|
| *H01L 51/52* | (2006.01) |
| *F21S 2/00* | (2006.01) |
| *F21V 23/06* | (2006.01) |
| *F21K 99/00* | (2010.01) |
| *F21V 21/005* | (2006.01) |
| *H05K 1/18* | (2006.01) |
| *H05K 1/14* | (2006.01) |
| *H05K 1/11* | (2006.01) |
| *F21Y 101/02* | (2006.01) |
| *F21Y 105/00* | (2006.01) |

(52) U.S. Cl.
CPC ... *F21Y2105/008* (2013.01); *H01L 2251/5338* (2013.01); *H05K 1/118* (2013.01); *H05K 1/142* (2013.01); *H05K 2201/09036* (2013.01); *H05K 2201/1031* (2013.01); *H05K 2201/10106* (2013.01); *H05K 2201/10189* (2013.01)

(56) References Cited

U.S. PATENT DOCUMENTS

| | | |
|---|---|---|
| 2010/0118532 A1 | 5/2010 | Liang et al. |
| 2011/0298359 A1 | 12/2011 | Hesse et al. |
| 2012/0019128 A1 | 1/2012 | Emde |
| 2012/0063139 A1* | 3/2012 | Benkart ............... B29C 39/10 362/249.02 |
| 2012/0311857 A1* | 12/2012 | Kampfrath ............ F21S 6/001 29/829 |
| 2013/0170238 A1 | 7/2013 | Diekmann et al. |

FOREIGN PATENT DOCUMENTS

| | | |
|---|---|---|
| DE | 102009054511 A1 | 6/2011 |
| DE | 102010023550 A1 | 12/2011 |
| DE | 102010039120 A1 | 2/2012 |
| DE | 102010039956 A1 | 3/2012 |
| WO | 2007013001 A1 | 2/2007 |
| WO | 2008040323 A1 | 4/2008 |
| WO | 2010116300 A1 | 10/2010 |

OTHER PUBLICATIONS

English abstract of DE 102010039120 A1 of Dec. 6, 2012.
Search Report issued in the corresponding German application No. 10 2011 056 570.1, dated Sep. 20, 2012.
International Search Report issued in the corresponding PCT/EP2012/075331 on Mar. 19, 2013.
Korean Office Action based on application No. 10-2014-7019815 (4 pages) dated Jun. 19, 2015 (for reference pupose only).

* cited by examiner

LIGHT-EMITTING COMPONENT ARRANGEMENT

RELATED APPLICATIONS

The present application is a national stage entry according to 35 U.S.C. §371 of PCT application No.: PCT/EP2012/075331 filed on Dec. 13, 2012, which claims priority from German application No.: 102011056570.1 filed on Dec. 16, 2011, and is incorporated herein by reference in its entirety.

TECHNICAL FIELD

Various embodiments relate to a light-emitting component arrangement.

BACKGROUND

In order to achieve a homogeneous luminous image from a light source device, for example from a surface light sources, also designated hereinafter as surface emitters (for example OLED light tiles (OLED: organic light-emitting diode), LED lighting panels (LED: light-emitting diode) or OLEC light source (OLEC: organic light-emitting diode based on carbon), contact-connections on all sides are usually used. For this purpose, electrical connections are necessary both on an individual surface light source and between a plurality of said surface light sources. These electrical connections and their electrical return line to at least one common connection location require space, which leads to an increased area requirement or an increased overall thickness particularly in the region of a surface light source itself. At locations at which a plurality of wires have to be led one above another in a manner insulated from one another (crossover points), this even leads to almost a doubling of the cable-determined thickness of the light source device.

An OLED light source device in which the OLED is arranged on a printed circuit (PCB) is known from the company Ledon OLED Lighting GmbH & Co. KG.

Furthermore, it is known to ensure only the electrical supply of the light source device via a flexible printed circuit board and the soldering points thereof. An additional mechanical fixing device (e.g. an additional clamping) is required for mechanically fixing a connection which is external to the printed circuit board.

SUMMARY

Various embodiments provide a light-emitting component arrangement which enables a simpler electrical and mechanical connection of the light source of the light-emitting component arrangement to a connection which is external to the printed circuit board.

Various embodiments provide a light-emitting component arrangement, including: at least one flexible printed circuit board; at least one light-emitting component coupled to the flexible printed circuit board; at least one electromechanical connecting part; wherein the connecting part is mechanically fixed to the flexible printed circuit board and is electrically coupled to the light-emitting component, and wherein the connecting part has an electromechanical connection for mechanically and electrically connecting a connecting element which is external to the printed circuit board.

In one configuration, the at least one light-emitting component may include at least one organic light-emitting component.

In another configuration, the light-emitting component arrangement may include a plurality of flexible printed circuit boards.

In another configuration, the at least one light-emitting component may include at least one organic light-emitting diode.

In another configuration, the at least one connecting part can be fixed in or to an edge region of the light-emitting component.

In another configuration, the at least one connecting part can be soldered, adhesively bonded, plugged and/or clamped onto the flexible printed circuit board.

In another configuration, the electromechanical connection may include a plug connector part.

In another configuration, the electromechanical connection may include a plug.

In another configuration, the electromechanical connection may include at least one hook.

In another configuration, the electromechanical connection may include at least one bayonet connection.

In another configuration, the electromechanical connection may include at least one clamp.

In another configuration, the flexible printed circuit board may include a plurality of contact regions, wherein each contact region includes an anode contact region and a cathode contact region; wherein a plurality of connecting parts can be provided, wherein a first connecting part is electrically coupled to the anode contact region of a first contact region of the plurality of contact regions and is electrically insulated from the cathode contact region of the first contact region, and wherein a second connecting part is electrically coupled to the cathode contact region of a second contact region of the plurality of contact regions and is electrically insulated from the anode contact region of the second contact region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

In the following detailed description, reference is made to the accompanying drawings, which form part of said description and show for illustration purposes specific embodiments in which the disclosure can be implemented. In this regard, direction terminology such as, for instance, "at the top", "at the bottom", "at the front", "at the back", "front", "rear", etc. is used with reference to the orientation of the figure(s) described. Since component parts of embodiments can be positioned in a number of different orientations, the direction terminology serves for illustration purposes and is not restrictive in any way at all. It goes without saying that other embodiments can be used and structural or logical modifications can be made, without departing from the scope of protection of the present disclosure. It goes without saying that the features of the different embodiments described herein can be combined with one another, unless specifically indicated otherwise. The following detailed description should therefore not be interpreted in a restrictive sense, and the scope of protection of the present disclosure is defined by the appended claims.

In the context of this description, the terms "connected", and "coupled" are used to describe both a direct and an indirect connection, and a direct or indirect coupling. In the figures, identical or similar elements are provided with identical reference signs, insofar as this is expedient.

Figure 1:
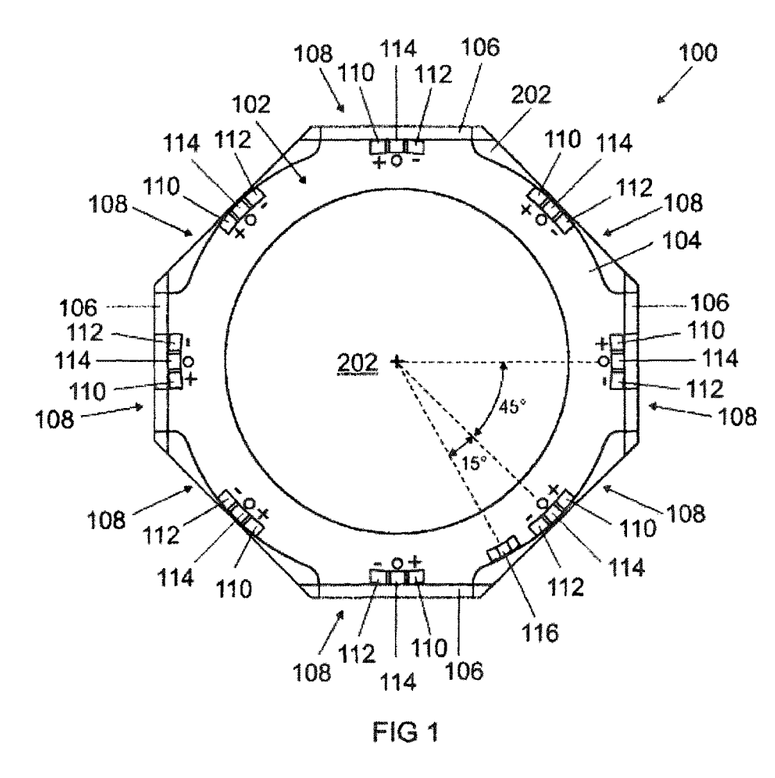
FIG. 1 shows a plan view of a part of a light-emitting component arrangement in accordance with one embodiment.

FIG. 1 shows a plan view of a part of a light-emitting component arrangement 100 in accordance with one embodiment. In various embodiments, the light-emitting component arrangement 100 includes at least one organic light-emitting diode (OLED). In other embodiments, however, the light-emitting component arrangement 100 may also include any other surface light sources, for example one or more light-emitting diodes (LED), for example in the form of an LED lighting panel, or one or more organic light-emitting diode(s) based on carbon (OLEC). The light-emitting component arrangement 100 illustratively forms a light source module which can be interconnected with other light source modules in any desired manner.

Figure 2:
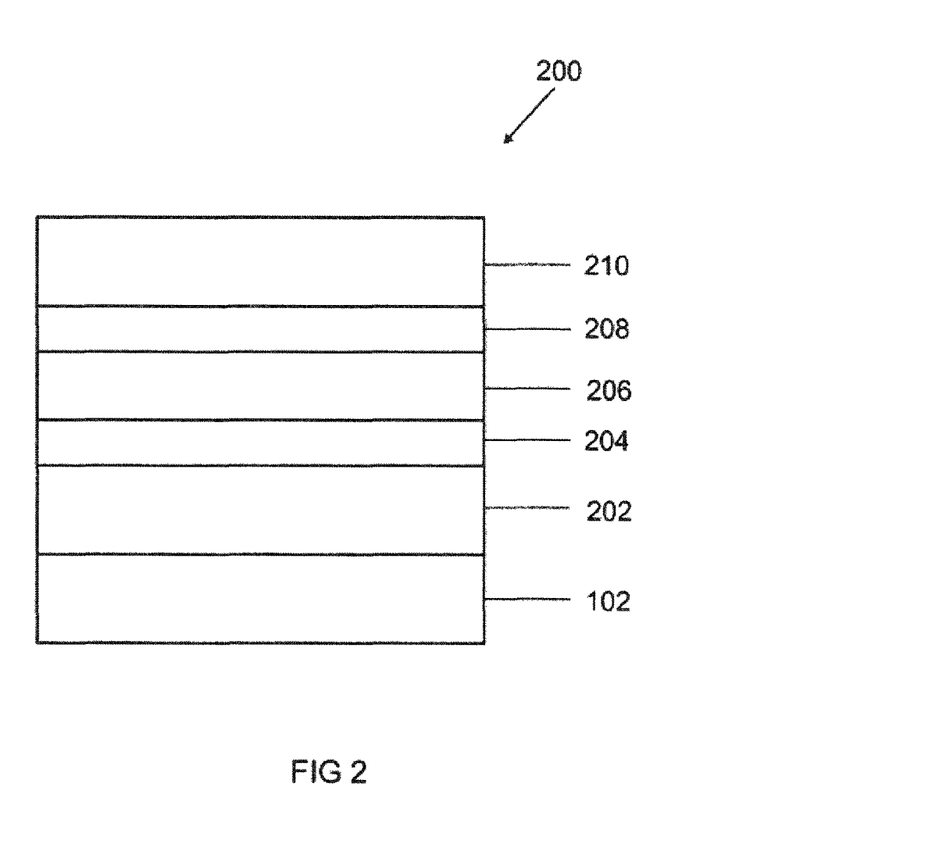
FIG. 2 shows a cross-sectional view through a light-emitting component of the light-emitting component arrangement from FIG. 1 in accordance with one embodiment.

FIG. 2 shows a cross-sectional view through the light-emitting component arrangement 100 from FIG. 1 in accordance with one embodiment with an OLED as light source, to put it another way as light-emitting component. It should be noted that an OLED constructed differently in any desired way can be provided in the light-emitting component arrangement 100 in various embodiments.

In various embodiments, the light source 200, for example the OLED, of the light source device 100 includes a substrate 202 and also a first electrode 204, also designated hereinafter as bottom electrode 204, which is applied, for example deposited, on the substrate.

A "substrate" 202 as used herein may include, for example, a substrate 202 usually used for an electronic component. The substrate 202 can be a transparent substrate 202. However, the substrate 202 can also be a nontransparent substrate 202. By way of example, the substrate 202 may include glass, quartz, sapphire, plastic film(s), metal, metal film(s), silicon wafers or some other suitable substrate material. A metal substrate is used, for example, if the electrode growth layer is not arranged directly thereon. In various configurations, substrate 202 is understood to mean the layer on which all other layers are subsequently applied during the production of the light source device 100. Such subsequent layers can be layers required for radiation emission e.g. in a light source device 100.

A metal substrate can be used, for example, if the electrode growth layer, as will be explained in even greater detail below, is not arranged directly thereon. In various embodiments, the bottom electrode 204 can be an anode, for example, and can be formed from indium-doped tin oxide (ITO) for example.

The first electrode 204 can be an anode or a cathode. The first electrode 204 can have hole-injecting or electron-injecting functions.

In various embodiments, the substrate 202 and/or the first electrode 204 can be embodied in a transparent fashion.

In various embodiments, the first electrode 204 can be applied by means of sputtering or by means of thermal evaporation. In various embodiments, the first electrode 204 can have a layer thickness in a range of approximately 5 nm to approximately 300 nm, for example a layer thickness in a range of approximately 100 nm to approximately 200 nm.

In various embodiments, one or more organic functional layers 206 for charge transport and for light generation, such as, for example, a fluorescent and/or a phosphorescent emitter layer is or are applied on the first electrode 204.

Examples of emitter materials which can be used in an OLED in accordance with various embodiments include organic or organometallic compounds, such as derivatives of polyfluorene, polythiophene and polyphenylene (e.g. 2- or 2,5-substituted poly-p-phenylene vinylene), and metal complexes, for example iridium complexes such as blue phosphorescent FIrPic (bis(3,5-difluoro-2-(2-pyridyl)phenyl-(2-carboxypyridyl)iridium III), green phosphorescent Ir(ppy)$_3$ (tris (2-phenylpyridine)iridium III), red phosphorescent Ru (dtb-bpy)$_3$*2(PF$_6$) (tris[4,4'-di-tert-butyl-(2,2')-bipyridine] ruthenium(III) complex) and blue fluorescent DPAVBi (4,4-bis[4-(di-p-tolyamino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters can be deposited by means of thermal evaporation, for example. Furthermore, it is possible to use polymer emitters, which can be deposited, in particular, by means of wet-chemical methods such as spin coating, for example.

The emitter materials can be embedded in a matrix material in a suitable manner.

The emitter materials of the emitter layers of the OLED can be selected, for example, such that the electronic component emits white light. The emitter layer may include a plurality of emitter materials that emit in different colors (for example blue and yellow, or blue, green and red); alternatively, the emitter layer can also be constructed from a plurality of partial layers, such as a blue fluorescent emitter layer, a green phosphorescent emitter layer and a red phosphorescent emitter layer. By mixing the different colors, the emission of light having a white color impression may result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation.

Provision can be made of further organic functional layers that serve, for example, to further improve the functionality and thus the efficiency of the electronic component.

It should be pointed out that, in alternative embodiments, any suitable form of light-emitting functional layers, for example organic functional layers, can be provided and the disclosure is not restricted to a specific type of functional layer(s).

In various embodiments, a transparent electrically conductive (for example metallic) top contact 208, for example in the form of a second electrode 208, can optionally be deposited on the one or the plurality of organic functional layers 206. The second electrode 208 can be formed by applying a (for example optically transparent) metal layer having a layer thickness of 5 nm to approximately 300 nm, for example a layer thickness in a range of approximately 100 nm to approximately 200 nm.

The metal layer may include at least one of the following metals: aluminum, barium, indium, silver, copper, gold, magnesium, samarium, platinum, palladium, calcium and lithium, and combinations thereof or this metal or a compound including this metal or including a plurality or these metals, for example an alloy.

The second electrode 208 including the metal layer is a cathode, for example, if the first electrode 204 is an anode.

In various embodiments, the transparent metallic top electrode 208 includes a 10 nm thick layer of silver or consists thereof, wherein the transparent metallic top electrode 208 can be applied by means of thermal evaporation.

As is furthermore shown in FIG. 2, an optical adapting layer 210 for coupling out light is applied, for example deposited or sputtered, onto the free surface of the transparent electrically conductive top contact 208.

The OLED illustrated in FIG. 2 as an implementation of a light source device 100 in accordance with various embodiments is configured as a top/bottom emitter. In alternative embodiments, the light source device 100 can be embodied as a "bottom emitter" or as a "top emitter".

It very generally holds true that, in the case of a top emitter or a bottom emitter, one electrode of the radiation-emitting device in the form of the growth electrode in accordance with various embodiments can be embodied as transparent and the other electrode as reflective. As an alternative thereto, both electrodes can also be embodied as transparent.

The term "bottom emitter" as used herein denotes an embodiment which is embodied as transparent toward the substrate side of the OLED. By way of example, for this purpose at least the substrate 202, the electrode and the electrode growth layer arranged between the substrate 202 and the electrode can be embodied as transparent. An OLED embodied as a bottom emitter can accordingly emit, for example, radiation generated in the organic functional layers 208 on the substrate side 202 of the OLED.

The term "top emitter" as used herein denotes, for example, an embodiment which is embodied as transparent toward the side of the second electrode of the OLED. In particular, for this purpose the electrode growth layer and the second electrode can be embodied as transparent. An OLED embodied as a top emitter can accordingly emit, for example, radiation generated in the organic functional layers on the side of the additional electrode of the OLED.

A light-emitting component arrangement 100 configured as a top emitter in accordance with various embodiments, in which the electrode growth layer and the metal layer are provided as top contact, can advantageously have high coupling-out of light and a very low angle dependence of the radiance. The radiation-emitting device in accordance with various embodiments can advantageously be used for lighting systems, such as, for example, room luminaires.

A combination of bottom emitter and top emitter is likewise provided in various embodiments. In the case of such an embodiment, the light-emitting component arrangement 100 is generally able to emit the light generated in the organic functional layers 208 in both directions—that is to say both toward the substrate side and toward the side of the second electrode.

In a further embodiment, at least one third electrode is arranged between the electrode and the additional electrode, and the electrode growth layer is arranged on that side of the third electrode which faces the substrate 202.

The "third electrode" can function as an intermediate contact. It can serve to increase charge transport through the layers of the light-emitting component arrangement 100 and thus to improve the efficiency of the light-emitting component arrangement 100. The third electrode can be configured as an ambipolar layer; it can be configured as a cathode or anode.

The third electrode is electrically contact-connected just like the electrode and the additional electrode.

In one development of the light-emitting component arrangement 100, an emitter layer and one or more further organic functional layers are contained as organic functional layers. The further organic functional layers can be selected from the group consisting of hole injection layers, hole transport layers, hole blocking layers, electron injection layers, electron transport layers and electron blocking layers.

In various embodiments, the OLED has a substantially Lambertian emission characteristic. The term "Lambertian emission characteristic" as used herein denotes the ideal emission behavior of a so-called Lambert emitter. A "substantially" Lambertian emission characteristic as designated herein in this case means, in particular, that the emission characteristic, which is calculated according to the formula $$I(\Theta)=I_0 \cdot \cos \Theta$$

and in which $I_0$ indicates the intensity relative to a surface normal and $\Theta$ indicates the angle with respect to the surface normal, for a given angle, in particular at an angle of between $-70°$ and $+70°$, for each given angle $\Theta$, deviates by not more than 10% from the intensity in accordance with the above-mentioned formula, that is to say $I(\Theta)=I_0 \cdot \cos \Theta \cdot x$, wherein $x=90\%-110\%$.

In this way, it may be possible to achieve a radiance or luminance of the OLED that is constant to all directions, such that the OLED appears equally bright in all directions. The brightness of the OLED can advantageously not change even when said OLED is tilted relative to the viewing direction.

In a further embodiment, the transparency of the OLED is greater than or equal to 60%. By way of example, the transparency can be greater than or equal to 65%. The transparency is measured by means of intensity measurements by predefined wavelength ranges being scanned and the quantity of light that passes through the radiation-emitting device being detected. In the case of a transparent OLED, the flexible PCB can be fashioned such that all functionalities lie outside the light exit surfaces.

The term "transparency" as used herein denotes the ability of the individual layers of the electronic component in accordance with various embodiments to transmit electromagnetic waves—and in particular visible light.

The transparency of the OLED in accordance with various embodiments is very generally more than 60%, preferably more than 65%, at least for at least one specific wavelength. By way of example, the transparency for at least one wavelength in a wavelength range of approximately 400 nm to approximately 650 nm can be more than 60% and for example more than 65%.

The OLED in accordance with various embodiments may furthermore include further functional layers, such as, for example, antireflection layers, scattering layers, layers for color conversion of light and/or mechanical protective layers. Such layers can be arranged, for example, on the metal layer of the growth electrode. The functional layers can be deposited by means of thermal evaporation, for example. These layers can further improve the function and efficiency of the OLED.

Furthermore, as illustrated in FIG. 2, the exposed surface of the substrate 202 can be arranged on a flexible printed circuit board 102 (FPCB). The printed circuit board 102 may include one material layer or a plurality (in principle any desired number) of printed circuit board layers. Furthermore, the printed circuit board 102 may include one or a plurality of (structured) electrically conductive layers which may include one or a plurality of electrically conductive (for example metallic) conductor tracks. The printed circuit board may include plastic, for example, or be produced therefrom, for example polyimide.

The provision of a printed circuit board having conductor tracks makes it possible to dispense with cables that require a considerable amount of space for returning an electrical potential through the light-emitting component arrangement 100, wherein the light-emitting component arrangement 100 is bridged without the returned electric current being passed through the light-emitting component arrangement 100 (and thus for example through the layers of the OLED that are illustrated in FIG. 2) itself, but rather only through the conductor track(s) of the printed circuit board 102 provided for the return.

In various embodiments, the use of one printed circuit board or of a plurality of thin printed circuit boards, which can also be embodied in a flexible fashion, thus enables the simple wiring of one or a plurality of the surface light sources. Said printed circuit boards can be made very thin in order to reduce the thickness application. Multilayered printed circuit boards (to put it another way, for example printed circuit boards having a plurality of conductor track planes) make it possible to realize crossover points in a very thin manner. The series connection of a plurality of surface light sources can be resolved by the integration of one or a plurality of feedthroughs in such a printed circuit board, without additional cables being necessary. Such a feedthrough is formed in the printed circuit board 102 by a conductive plane which need only be contained in specific parts of the printed circuit board 102. Other regions of the printed circuit board 102 can be deliberately omitted, in order also not to influence transparent surface light sources at these locations. The embodiment as a flexible printed circuit board also enables use for making contact with flexible surface light sources.

In various embodiments, the light-emitting component arrangement 100 has in plan view an arbitrary shape, for example a round shape (e.g. circular or elliptic), alternatively a shape having a fundamentally arbitrary number of vortices and edges (e.g. a polygonal shape such as, for example, the shape of a triangle, quadrilateral (e.g. rectangle), pentagon, hexagon, heptagon, octagon, etc., regular or irregular).

In the implementation illustrated in FIG. 1, the light-emitting component arrangement 100 has the shape of a regular octagon in plan view.

The printed circuit board 102 can have a shape adapted to the shape of the light-emitting component arrangement 100, for example in the overall shape or only in parts, for example in an outer region or edge region of the light-emitting component, in which, for example, connections for feeding or providing electrical energy (in the form of electric current or electrical potential) can be provided. In various embodiments, the printed circuit board 102 has a ring shape including a ring-shaped region 104 and, at some regions along the circumference of the ring-shaped region 104, outwardly extending regions (for example rectangular regions) 106 (for example also designated as edge regions hereinafter).

In various embodiments, the printed circuit board 102 includes a plurality of connections 108 which are coupled to the light source 200 and which can serve as input connections or as output connections, depending on external contact-making.

In various embodiments, each of the connections 108 may include a first potential connection 110 for making contact, in a manner external to the device, with a first electrical potential (for example a first potential input connection 110 for feeding in a first electrical potential or a first potential output connection 110 for providing a first electrical potential) and a second potential connection 112 for making contact, in a manner external to the device, with a second electrical potential (which can be equal to or different than the first electrical potential (for example a second potential input connection 112 for feeding in a second electrical potential or a second potential output connection 112 for providing a second electrical potential). The first electrical potential can be higher than the second electrical potential and is also designated by the symbol "+" in FIG. 1; correspondingly, the second electrical potential is also designated by the symbol "−" in FIG. 1. Consequently, in various embodiments, the first potential connection 110 can be designated as the cathode region and the second potential connection 112 can be designated as the anode region. A respective first potential connection 110 and a respective second potential connection 112 are contained in a common contact region.

Even though eight connections 108 are provided in the case of the printed circuit board 102 in accordance with FIG. 1, it should be noted that, in principle, any desired number of connections can be provided, for example two, three, four, five, six, seven, eight or more.

In various embodiments, the first potential connection 110 can be connected to a first contact, for example the first electrode (for example the first electrode 204), for example the anode, of the light source 200, and the second potential connection 112 can be connected to a second contact, for example the second electrode (for example the second electrode 208), for example the cathode, of the light source 200. In alternative embodiments, the first potential connection 110 can be connected to the cathode of the light source 200, and the second potential connection 112 can be connected to the anode of the light source 200. Furthermore, in accordance with various embodiments, each of the connections 108 may include a bridging connection 114 (also designated as through-conduction connection 114 hereinafter). In various embodiments, a bridging connection 114 is electrically coupled not to the light source 200 itself but rather, by means of one or a plurality of conductor tracks of the printed circuit board 102, to another bridging connection 114 of the printed circuit board 102, whereby an electrical potential applied to one bridging connection 114 of the printed circuit board 102 is merely "looped" through the printed circuit board 102 past the light source 200 and, at the other bridging connection 114, to which the bridging connection 114 is coupled, is provided externally to another light source device 102 or another electronic device. In various embodiments, the at least one conductor track serving as a return is integrated (monolithically) into the printed circuit board 102.

It should be noted that, in various embodiments, one or a plurality of bridging connections 114 can be provided separately, independently of a connection 108 and for example independently of the potential connections of the connections 108 such as have been described above.

Furthermore, the printed circuit board 102 may further include a protective diode 116, for example in the form of a Schottky diode 116.

Furthermore, in various embodiments, the light-emitting component arrangement may include one or a plurality of getter elements which consist of a getter material or include the latter for binding, for example, oxygen and/or water or the like.

In various embodiments, a thin-film encapsulation may be provided. In the context of this application, a "thin-film encapsulation" or a "barrier thin film" can be understood to mean, for example, a layer or a layer structure which is suitable for forming a barrier against chemical impurities or atmospheric substances, in particular against water (moisture) and oxygen. In other words, the thin-film encapsulation is formed in such a way that OLED-damaging substances such as water, oxygen or solvent cannot penetrate through it or at most very small proportions of said substances can penetrate through it.

In accordance with one configuration, the thin-film encapsulation can be formed as an individual layer (to put it another way, as a single layer). In accordance with an alternative configuration, the thin-film encapsulation may include a plurality of partial layers formed one on top of another. In other words, in accordance with one configuration, the thin-film encapsulation can be formed as a layer stack. The thin-film encapsulation or one or a plurality of partial layers of the thin-film encapsulation can be formed for example by means of a suitable deposition method, e.g. by means of an atomic layer deposition (ALD) method in accordance with one configuration, e.g. a plasma enhanced atomic layer deposition (PEALD) method or a plasmaless atomic layer deposition (PLALD) method, or by means of a chemical vapor deposition (CVD) method in accordance with another configuration, e.g. a plasma enhanced chemical vapor deposition (PECVD) method or a plasmaless chemical vapor deposition (PLCVD) method, or alternatively by means of other suitable deposition methods.

In various embodiments, a very flat integration of surface light sources in various applications (for example luminaires, furniture, vehicles or consumer products) is provided, as a result of the avoidance of a thickness application of wires behind the surface light sources.

FIGS. 3A to 3D show different elements of a light-emitting component arrangement from FIG. 1 in accordance with one embodiment.

Figure 3A:
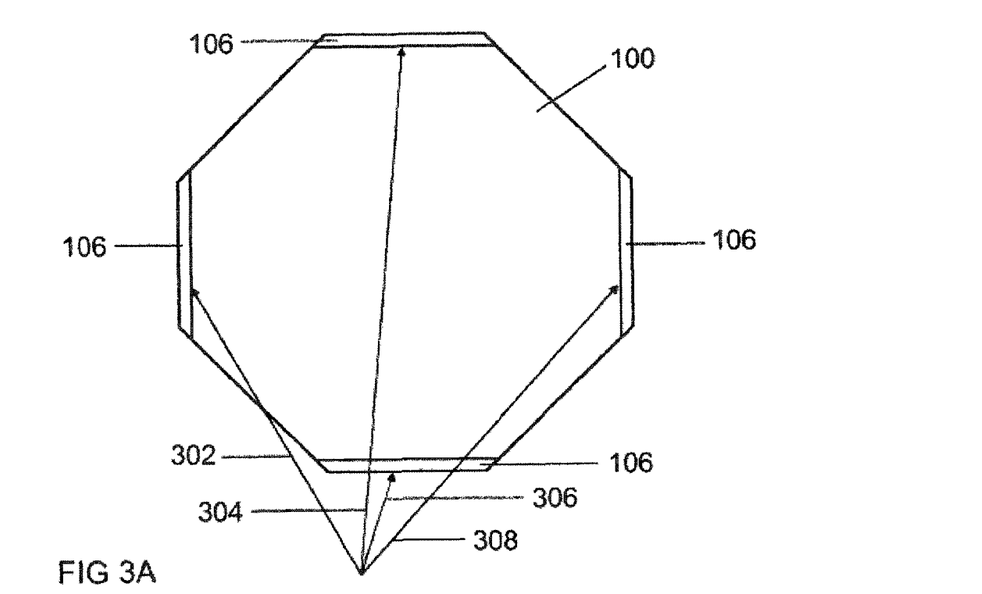
FIGS. 3A to 3D show different elements of a light-emitting component arrangement from FIG. 1 in accordance with one embodiment.

FIG. 3A shows in plan view, in a simplified illustration, the light-emitting component arrangement 100, for example the flexible printed circuit board and the light-emitting component with edge regions 106, which in this case are embodied in the form of a (stepped) edge depression.

Figure 3B:
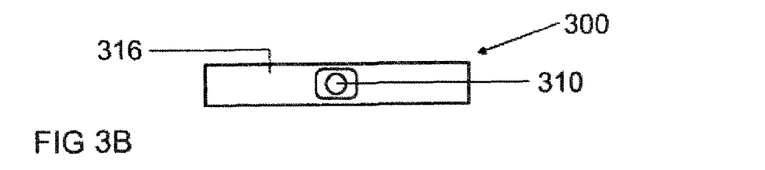

FIG. 3B shows an electromechanical connecting part 300 in plan view. A respective electromechanical connecting part 300 can, as illustrated in FIG. 3A and FIG. 3B by means of arrows 302, 304, 306, 308, be provided in a respective edge region 106 provided with an edge depression and can be fixed there, for example can be soldered, adhesively bonded, plugged, and/or clamped on there. Consequently, the connecting part 300 is mechanically fixed to the flexible printed circuit board (for example in or to a respective edge region 106 of the light-emitting component).

On the underside 312 (see FIG. 3C) of the electromechanical connecting part 300, which underside is not illustrated in FIG. 3B and bears on the exposed surface of the edge region 106, at least one electrically conductive contact region 314 (see FIG. 3C) is provided, by means of which the electromechanical connecting part 300 can be electrically coupled to the first potential connection 110 and/or to the second potential connection 112 of the flexible printed circuit board 102.

Figure 3C:
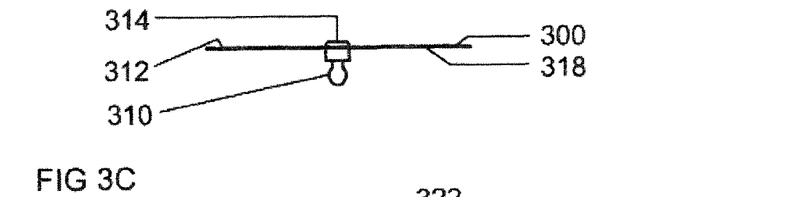
Figure 3D:
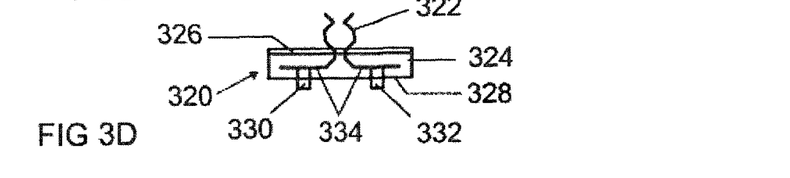

The electromechanical connecting part 300 may include a connecting part body (generally carrier) 316, on the underside of which is applied the electrically conductive contact region 314 and on the top side 318 of which is applied an electromechanical connection 310, for mechanically and electrically connecting a connecting element 320 which is external to the printed circuit board (see FIG. 3D). The electromechanical connection 310 may be embodied as a plug (to put it another way as a male plug connector part or as a pin) or as a socket (to put it another way as a female plug connector part, to put it another way as a plug receiving element). In various embodiments, the electrically conductive contact region 314 is electrically connected to the electromechanical connection 310 through the connecting part body 316.

In various embodiments, the connecting part body 316 may be produced from electrically insulating material, for example from a plastic.

FIG. 3C shows the electromechanical connecting part 300 in side view.

FIG. 3D shows a connecting element 320 which is external to the printed circuit board and which is embodied in a manner corresponding to the electromechanical connecting part 300, in side view.

As is illustrated in FIG. 3D, the connecting element 320 which is external to the printed circuit board includes a counterpart 322 corresponding to the electromechanical connection 310, in the example illustrated in FIG. 3C and FIG. 3D a plug receiving element 322 (for example in the form of a clamp 322, for example a metal clamp 322), which is arranged on a first side 326 of a connecting element body 324 (generally a carrier). On a second side 328 of the connecting element body 324, said second side being situated opposite the first side 326, in various embodiments, electrically conductive structures 330, 332, for example wires 330, 332 (for example metal wires 330, 332) or electrically conductive tapes 330, 332, are arranged and are electrically coupled to the counterpart 322 by means of electrically conductive connections 334 running through the connecting element body 324.

In this way, both an electrical coupling and a mechanical coupling between external conductors, for example cables or wires, and the flexible printed circuit board 102 and, as a result, to the light-emitting component 200, for example an OLED 200, are provided in a very simple and cost-effective manner.

In various embodiments, the mechanical coupling between the electromechanical connection 310 and the connecting element 320 which is external to the printed circuit board, that is to say for example the coupling of the plug 310 received in the clamp 322, can be designed to be mechanically releasable. Alternatively, the coupling can also be designed to be non-releasable, in which case for example in the counterpart 322 provision is made of structures, for example barbs, which prevent release of the electromechanical connection 310 from the counterpart 322.

FIGS. 4A to 4D show different elements of a light-emitting component arrangement from FIG. 1 in accordance with one embodiment.

Figure 4A:
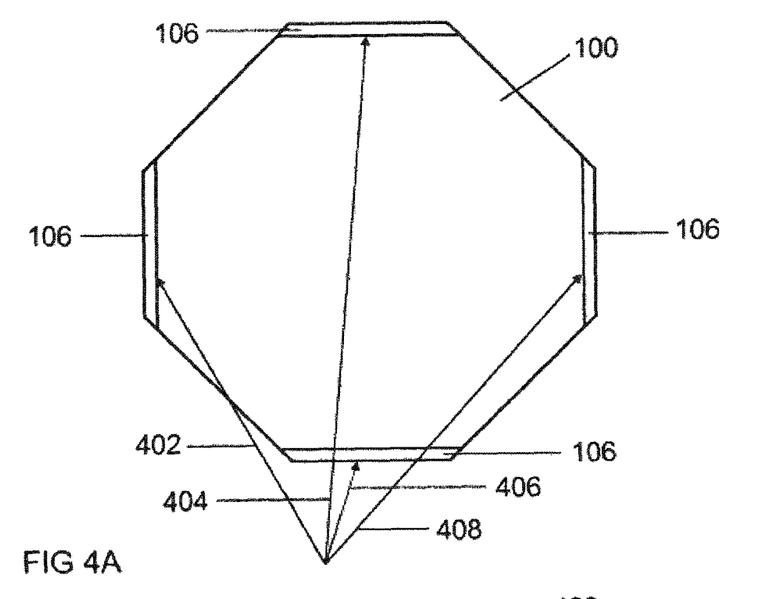
FIGS. 4A to 4D show different elements of a light-emitting component arrangement from FIG. 1 in accordance with one embodiment.

FIG. 4A shows in plan view, in a simplified illustration, the light-emitting component arrangement 100, for example the flexible printed circuit board and the light-emitting component with edge regions 106, which in this case are embodied in the form of a (stepped) edge depression.

Figure 4B:
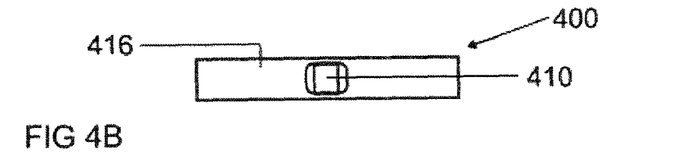

FIG. 4B shows an electromechanical connecting part 400 in plan view. A respective electromechanical connecting part 400 can, as illustrated in FIG. 4A and FIG. 4B by means of arrows 402, 404, 406, 408, be provided in a respective edge region 106 provided with an edge depression and can be fixed there, for example can be soldered, adhesively bonded, plugged, and/or clamped on there. Consequently, the connecting part 400 is mechanically fixed to the flexible printed circuit board (for example in or to a respective edge region 106 of the light-emitting component).

On the underside 412 (see FIG. 4C) of the electromechanical connecting part 400, which underside is not illustrated in FIG. 4B and bears on the exposed surface of the edge region 106, at least one electrically conductive contact region 414 (see FIG. 4C) is provided, by means of which the electromechanical connecting part 400 can be electrically coupled to the first potential connection 110 and/or to the second potential connection 112.

Figure 4C:
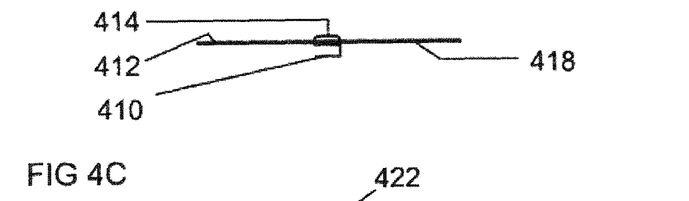
Figure 4D:
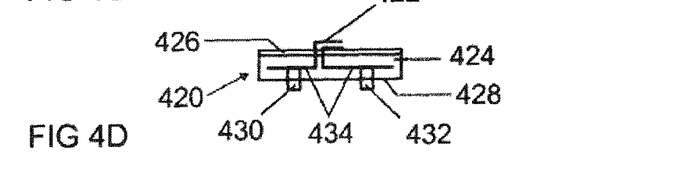

The electromechanical connecting part 400 may include a connecting part body (generally carrier) 416, on the underside of which is applied the electrically conductive contact region 414 and on the top side 418 of which is applied an electromechanical connection 410, for mechanically and electrically connecting a connecting element 420 which is external to the printed circuit board (see FIG. 4D). The electromechanical connection 410 may be embodied as a hook. In various embodiments, the electrically conductive contact region 414 is electrically connected to the electromechanical connection 410 through the connecting part body 416.

In various embodiments, the connecting part body 416 may be produced from electrically insulating material, for example from a plastic.

FIG. 4C shows the electromechanical connecting part 400 in side view.

FIG. 4D shows a connecting element 420 which is external to the printed circuit board and which is embodied in a manner corresponding to the electromechanical connecting part 400, in side view.

As is illustrated in FIG. 4D, the connecting element 420 which is external to the printed circuit board includes a counterpart 422 corresponding to the electromechanical connection 410, in the example illustrated in FIG. 4C and FIG. 4D a corresponding hook 422, which is arranged on a first side 426 of a connecting element body 424 (generally a carrier). On a second side 428 of the connecting element body 424, said second side being situated opposite the first side 426, in various embodiments, electrically conductive structures 430, 432, for example wires 430, 432 (for example metal wires 430, 432) or electrically conductive tapes 430, 432, are arranged and are electrically coupled to the counterpart 422 by means of electrically conductive connections 434 running through the connecting element body 424.

In this way, both an electrical coupling and a mechanical coupling between external conductors, for example cables or wires, and the flexible printed circuit board 102 and, as a result, to the light-emitting component 200, for example an OLED 200, are provided in a very simple and cost-effective manner.

In alternative embodiments (not illustrated), the electromechanical connection can also be embodied in a different form, as long as the counterpart provides an electromechanical coupling. In this regard, by way of example, the electromechanical connection can be embodied as a bayonet connection or in the form of a clamp or in some other suitable form.

In various embodiments, the mechanical coupling between the electromechanical connection 410 and the connecting element 420 which is external to the printed circuit board, that is to say for example the coupling of the hooks 410, 422, may be designed to be mechanically releasable. Alternatively, the coupling may also be designed to be non-releasable, in which case for example in the counterpart 422 provision is made of structures, for example barbs, which prevent release of the electromechanical connection 410 from the counterpart 422.

Figure 5:
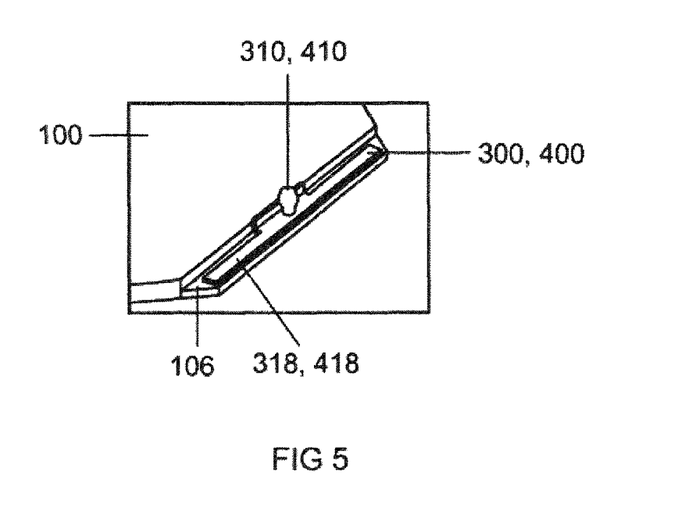
FIG. 5 shows a perspective view of a light-emitting component arrangement from FIG. 1 in accordance with one embodiment with a connecting part.

FIG. 5 shows a perspective view of the light-emitting component arrangement 100 from FIG. 1 in accordance with one embodiment with a connecting part 300, 400. As is illustrated in FIG. 5, the connecting part 300, 400 is applied in the depression of the edge region 106.

Figure 6A:
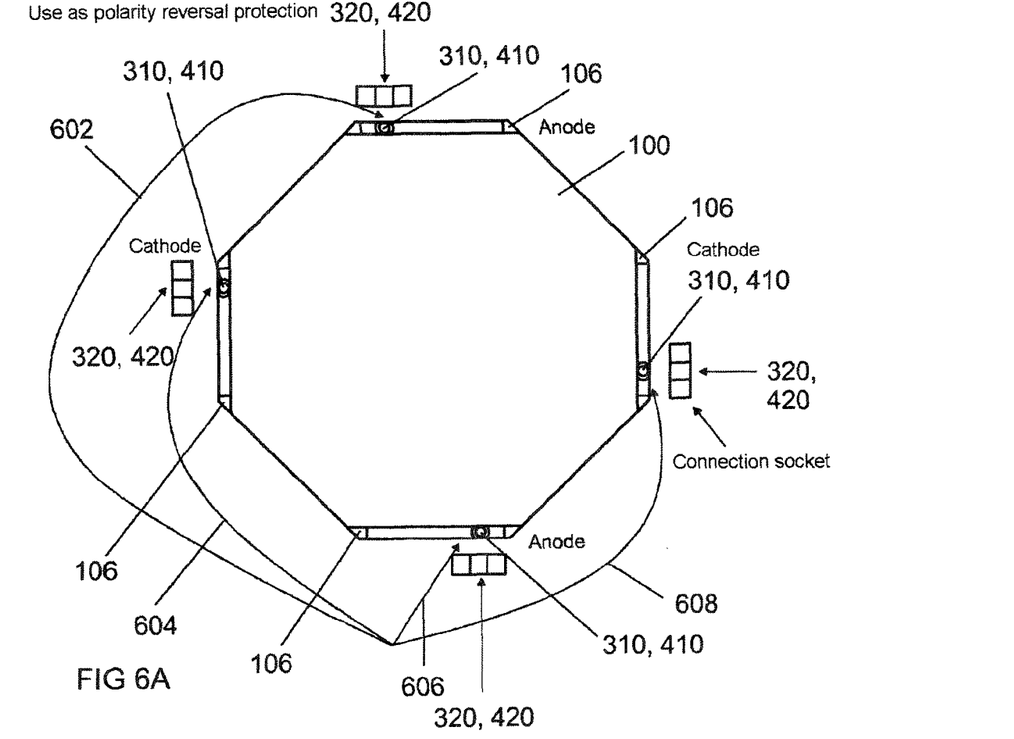
FIGS. 6A to 6C show different elements of a light-emitting component arrangement from FIG. 1 in accordance with one embodiment.
Figure 6B:
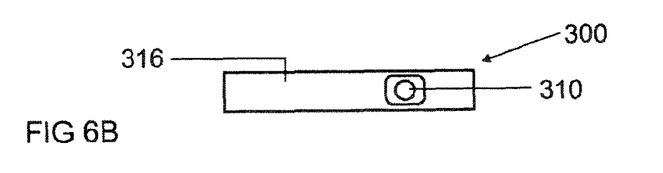
Figure 6C:
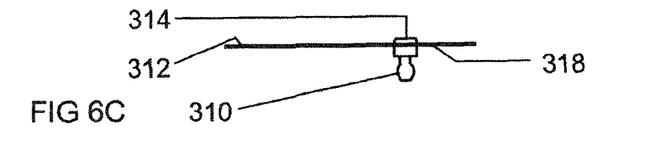

FIG. 6A to FIG. 6C show different elements of a light-emitting component arrangement from FIG. 1 in accordance with one embodiment.

In various embodiments, the at least one flexible printed circuit board may include a plurality of contact regions, wherein each contact region includes an anode contact region and a cathode contact region. As is illustrated in FIG. 6A by means of arrows 602, 604, 606, 608, a respective connecting part 300, 400 can be arranged in a respective edge region 106 (for example provided with a depression), wherein polarity reversal protection can be provided.

A first connecting part can be electrically coupled to the anode contact region of a first contact region of the plurality of contact regions and can be electrically insulated from the cathode contact region of the first contact region. Furthermore, a second connecting part can be electrically coupled to the cathode contact region of a second contact region of the plurality of contact regions and can be electrically insulated from the anode contact region of the second contact region.

As is illustrated in FIG. 6A, the connection sockets, for example generally the connecting elements 320, 420 which are external to the printed circuit board, can be arranged at fixedly predefined positions relative to the regions at which the connecting parts 300, 400 are arranged. The electromechanical connections 310, 410 of the respective connecting parts 300, 400 are arranged in such a way that they match the connection sockets 320, 420 only for two rotation orientations of the light-emitting component arrangement 100, illustratively for the orientation shown in FIG. 6A and for an orientation rotated by 180° with respect thereto, wherein the axis of rotation runs perpendicularly to the plane of the drawing. By contrast, if the light-emitting component arrangement 100 is rotated only by 90°, then it is evident that the electromechanical connections 310, 410 do not match the connection sockets 320, 420. Reliable polarity reversal protection is achieved in this way.

In various embodiments, the light-emitting component can be designed as a surface light source, also designated as surface emitter or as surface emitter light source.

In various embodiments, a surface light source can be understood as a light source which generates light from a source having an areal extent, in contrast to a point light source, such as an incandescent lamp, for example. Various examples of a surface light source include light-emitting diodes (LED), for example in the form of an LED lighting panel including a plurality of LEDs coupled to one another, organic light-emitting diodes (OLED), for example in the form of an OLED light tile including a plurality of OLEDs coupled to one another, an OLEC light source (wherein an OLEC is understood to be an organic light-emitting diode based on carbon), for example in the form of an OLEC light tile including a plurality of OLECs coupled to one another.

The flexible printed circuit board may include one layer or a plurality of layers, for example with one conductor track plane or with a plurality of conductor track planes (each including one or a plurality of conductor tracks, for example).

The combination of an electrically conductive, mechanical connecting part (for example plug, hook, etc.) with a flexible PCB (for example by means of soldering) enables an electromechanical connection of light-emitting components (for example organic light-emitting components such as OLED components, for example). In various embodiments, polarity reversal protection can additionally be realized by an appropriate arrangement of the connecting parts.

The connecting parts may assume various forms. A matching counterpiece may be provided for fixing conductors which are external to the printed circuit board.

In various embodiments, further mechanical fixing is no longer required.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A light-emitting component arrangement, comprising:
   at least one flexible printed circuit board having at least one edge region wherein the at least one edge region is provided with an edge depression;
   at least one light-emitting component coupled to the flexible printed circuit board;
   at least one electromechanical connecting part;
   wherein the at least one electromechanical connecting part is mechanically fixed to the flexible printed circuit board and is electrically coupled to the light-emitting component, and wherein the at least one electromechanical connecting part includes a connecting part body having a top side and an underside, wherein the underside of the at least one electromechanical connecting part is provided with at least one electrically conductive contact region by means of which the electromechanical connecting part is electrically coupled to the flexible printed circuit board,
   wherein the at least one electromechanical connecting part is provided in the edge depression of the at least one edge region such that the underside bears on an exposed surface of the edge region,
   wherein the at least one electromechanical connecting part has an electromechanical connection on the top side for mechanically and electrically connecting a connecting element which is external to the printed circuit board wherein the at least one electrically conductive contact region is electrically connected to the electromechanical connection through the connecting part body.

2. The light-emitting component arrangement as claimed in claim 1,
   wherein the at least one light-emitting component comprises at least one organic light-emitting component.

3. The light-emitting component arrangement as claimed in claim 2,
   wherein the at least one light-emitting component comprises at least one organic light-emitting diode.

4. The light-emitting component arrangement as claimed in claim 1,
   wherein the at least one electromechanical connecting part is soldered, adhesively bonded, plugged, and/or clamped onto the flexible printed circuit board.

5. The light-emitting component arrangement as claimed in claim 1,
   wherein the electromechanical connection comprises a plug connector part.

6. The light-emitting component arrangement as claimed in claim 1,
   wherein the electromechanical connection comprises at least one hook.

7. The light-emitting component arrangement as claimed in claim 1,
   wherein the electromechanical connection comprises at least one bayonet connection or comprises at least one clamp.

8. The light-emitting component arrangement as claimed in claim 1,
   wherein the at least one flexible printed circuit board comprises a plurality of contact regions, wherein each contact region comprises an anode contact region and a cathode contact region;
   wherein a plurality of electromechanical connecting parts are provided, wherein a first electromechanical connecting part is electrically coupled to the anode contact region of a first contact region of the plurality of contact regions and is electrically insulated from the cathode contact region of the first contact region, and wherein a second electromechanical connecting part is electrically coupled to the cathode contact region of a second contact region of the plurality of contact regions and is electrically insulated from the anode contact region of the second contact region.

\* \* \* \* \*